United States Patent
Nakashiba

[11] Patent Number: 5,861,642
[45] Date of Patent: *Jan. 19, 1999

[54] SEMICONDUCTOR DEVICE HAVING CHARGE TRANSFER DEVICE EQUIPPED WITH THREE SEMICONDUCTOR LAYERS OF SAME CONDUCTIVITY TYPE WITH MUTUALLY DIFFERENT CONCENTRATIONS

[75] Inventor: Yasutaka Nakashiba, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 691,393

[22] Filed: Aug. 2, 1996

[30] Foreign Application Priority Data

Aug. 9, 1995 [JP] Japan .................................. 7-202642

[51] Int. Cl.$^6$ ........................ H01L 27/148; H01L 29/768
[52] U.S. Cl. ......................... 257/221; 257/219; 257/227; 257/236; 257/246; 438/60; 438/75
[58] Field of Search .................................. 257/218, 219, 257/221, 227, 236, 246, 248; 438/60, 75

[56] References Cited

U.S. PATENT DOCUMENTS

| | | | |
|---|---|---|---|
| 4,621,369 | 11/1986 | Narabu et al. | 377/60 |
| 5,286,987 | 2/1994 | Watanabe | 257/221 |
| 5,289,022 | 2/1994 | Iizuka et al. | 257/232 |
| 5,315,137 | 5/1994 | Asaumi et al. | 257/221 |

*Primary Examiner*—Mahshid D. Saadat
*Assistant Examiner*—Allan R. Wilson
*Attorney, Agent, or Firm*—Whitham, Curtis & Whitham

[57] ABSTRACT

The semiconductor device of the present invention is equipped with a plurality of photodiodes, a horizontal transfer part and a vertical transfer part, and in particular, the horizontal transfer part or the vertical transfer part has a configuration described as in the following. Namely, the device has a semiconductor region which is formed by regularly and consecutively arranging a plurality of blocks of the same conductivity type, where each of the plurality of the blocks is equipped with three regions of mutually different impurity concentrations, clock pulses are applied to two regions out of the three regions and the voltage of the high level or low level of the clock pulse is applied to the remaining region out of the three regions as a constant potential.

9 Claims, 7 Drawing Sheets

SEMICONDUCTOR DEVICE HAVING CHARGE TRANSFER DEVICE EQUIPPED WITH THREE SEMICONDUCTOR LAYERS OF SAME CONDUCTIVITY TYPE WITH MUTUALLY DIFFERENT CONCENTRATIONS

BACKGROUND OF THE INVENTION

1. Field of the Invention

The present invention relates to a semiconductor device, and more particularly, to a semiconductor device having a charge transfer device controlled by two driving pulses.

2. Description of the Related Art

In a solid-state image pickup device such as a charge coupled device (CCD), the electrons produced by a photodiode are utilized as means of conveying image information. In order to transfer the image information to a signal processor such as a display which actually restores the information, a charge transfer device is called for. The charge transfer device is controlled by a control device placed outside of the transfer device. As is well known, the charge transfer device may be referred either to a vertical transfer part or to a horizontal transfer part of a CCD.

For example, the two-phase drive charge transfer device disclosed in Japanese Laid-Open Patent Publication Hei 6-314706 (1994) has the following a structure.

FIG. 1(a) shows the structure of the charge transfer device. The device has an N-type semiconductor layer 2 formed on a P-type semiconductor substrate 1. In the N-type semiconductor layer 2, there are formed N$^-$-type semiconductor regions 6 by a selective ion implantation of, for example, boron. As a result, there are formed alternating regions of N-type and N$^-$-type. A silicon oxide film, that is, an insulating film 3 is formed by thermal oxidation on the N-type semiconductor regions 2 and the N$^-$-type semiconductor regions 6. First electrodes 4 are formed on the insulating film 3 so as to cover each of a part of the N-type semiconductor regions 2. An insulating film 5 is formed on the first electrode. Further, second electrodes 8 are formed so as to cover each of the remaining part of the N-type semiconductor region 2 and a part of each of the N$^-$-type semiconductor regions 6. As shown in FIG. 1(a), the second electrodes 8 are formed consecutively, grouped into two types of even-numbered electrodes 8a and odd-numbered electrodes 8b. The electrodes 8a receive a clock pulse $\phi_1$ from a control device while the electrodes 8b receive a clock pulse $\phi_2$ from the control device. The first electrodes 4 receive a constant voltage $V_M$.

Next, referring to FIGS. 1(b), 1(c) and 1(d), the operation of the charge transfer device as shown in FIG. 1(a) will be described. The clock pulses $\phi_1$ and $\phi_2$ are signals that vary complementary with each other as shown in FIG. 2. The constant voltage $V_M$ is an inter-mediate potential between the high level and the low level of the clock pulses $\phi_1$ and $\phi_2$. FIG. 1(b) shows an electric potential diagram of the device at the time tb in FIG. 2. Similarly, FIGS. 1(c) and 1(d) are electrical potential diagrams at the times tc and td, respectively, in FIG. 2. In the description that follows it will be assumed that the charge transfer device illustrated by FIG. 1(a) represents a horizontal transfer part of a CCD.

At the time tb, a high level voltage $V_H$ is applied to the electrodes 8a and a low level voltage $V_L$ is applied to the electrodes 8b. In this situation, the transfer of a signal charge 110 transferred from a vertical transfer part of the CCD will now be described.

In this case, signal charges 110 are accumulated in the N-type semiconductor regions 2 covered with the electrodes 8a. This is because the electrodes 8a are receiving the high level voltage $V_H$, and hence their electric potential is the deepest.

At the time tc, the electric potential of the semiconductor regions covered with the electrodes 8a becomes shallow and the electric potential of the semiconductor regions covered with the electrodes 8b becomes deep, due to variations in the potentials of the clock pulses $\phi_1$ and $\phi_2$. The situation is as illustrated in FIG. 1(c).

At the time td, the low level voltage $V_L$ is applied to the electrodes 8a and the high level voltage $V_H$ is applied to the electrodes 8b. In comparison to the situation at the time tc, the electric potential of the semiconductor regions covered with the electrodes 8a becomes shallower and the electric potential of the semiconductor regions covered with the electrodes 8b becomes deeper. Accordingly, the signal charges 110 accumulated at the time tb in the N-type semiconductor regions 2 covered with the electrodes 8a make transitions at the time td as indicated by the arrow in FIG. 1(d). That is, the charges, are accumulated in the N-type semiconductor regions 2 covered with the electrodes 8b.

Thereafter, the signal charges 110 are transferred sequentially by the repetition of the above operation.

However, a CCD chip with the conventional charge transfer device built in requires a constant voltage $V_M$ which is different from the voltages $V_H$ and $V_L$ that can be taken by the clock pulses $\phi_1$ and $\phi_2$. Hence, it is necessary to install a constant voltage generator which generates the constant voltage $V_M$ by processing a power supply voltage, on the outside or inside of the chip. When the constant voltage generator is installed within the chip, the CCD chip will necessarily become large sized. On the contrary, when the constant voltage generator is installed outside the chip, it becomes necessary to furnish terminals to receive the constant voltage on the CCD chip, which will also hamper the miniaturization of the chip.

SUMMARY OF THE INVENTION

It is the object of the present invention to provide a semiconductor device equipped with a charge transfer device which makes it possible to miniaturize the chip.

The semiconductor device according to this invention includes a plurality of photodiodes, a horizontal transfer part and a vertical transfer part, and in particular, the horizontal transfer part and the vertical transfer part have the following configuration. Namely, the device has a semiconductor region which is formed by regularly and consecutively arranging a plurality of blocks of the same conductivity type, where each of the plurality of blocks is equipped with three regions having mutually different impurity concentrations. Clock pulses are applied to two of the three regions, and the voltage of the high level or the low level of the clock pulses is applied to the remaining one of the three regions as a constant potential.

Consequently, according to the configuration of this invention two voltage levels suffice for the charge transfer operation in contrast to the requirement of three voltage levels in the conventional charge transfer. Hence, the semiconductor device having the charge transfer device according to this invention will make it possible to reduce the number of terminals compared with the conventional semiconductor device.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 3:
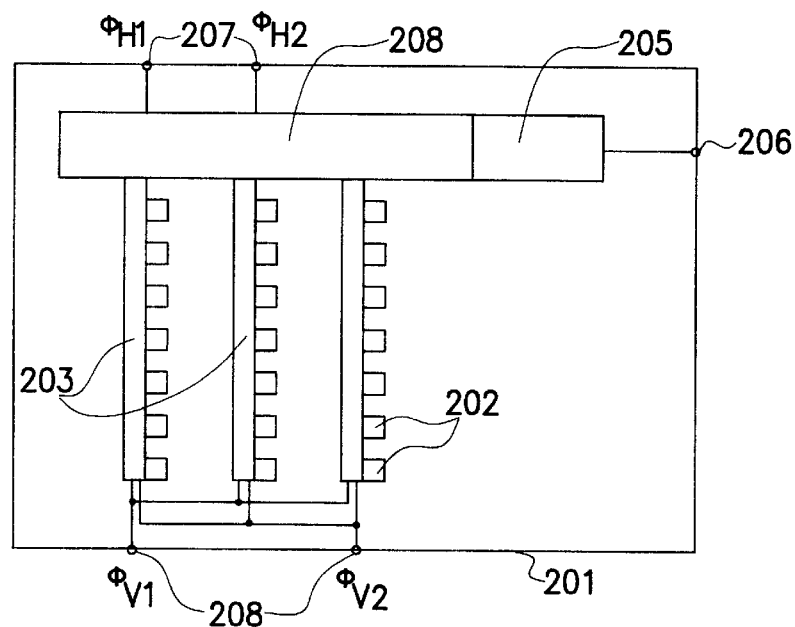
FIG. 3 is an example of semiconductor device in which the charge transfer device according to this invention is employed.

FIG. 3 is a diagram showing an embodiment of the semiconductor device of this invention. This semiconductor device is constituted of a single chip 201. Signal charge from a plurality of photodiodes 202 is transferred by a vertical transfer part 203 to a horizontal transfer part 204. The horizontal transfer part 204 sequentially transfers signal charges transferred from the vertical transfer part 203 to an output circuit 205. The output circuit 205 outputs the received signal charges as a serial signal from an output terminal 206. The vertical transfer part 203 and the horizontal transfer part 204 are two-phase drive type charge transfer device. Consequently, the vertical transfer part 203 is driven by receiving mutually complementary clock pulses $\phi_{V1}$ and $\phi_{V2}$ from clock input terminals 208. The horizontal transfer device 204 is driven by receiving mutually complementary clock pulses $\phi_{H1}$ and $\phi_{H2}$ from clock input terminals 207. The clock pulses $\phi_{V1}$, $\phi_{V2}$, 100 $_{H1}$, and $\phi_{H2}$ are generated by a control circuit installed outside the chip 201. Such a control device controls not only the drive of the chip 201, but also other devices such as a display which displays the signal output from the output terminal 206 as an image signal.

Figure 4:
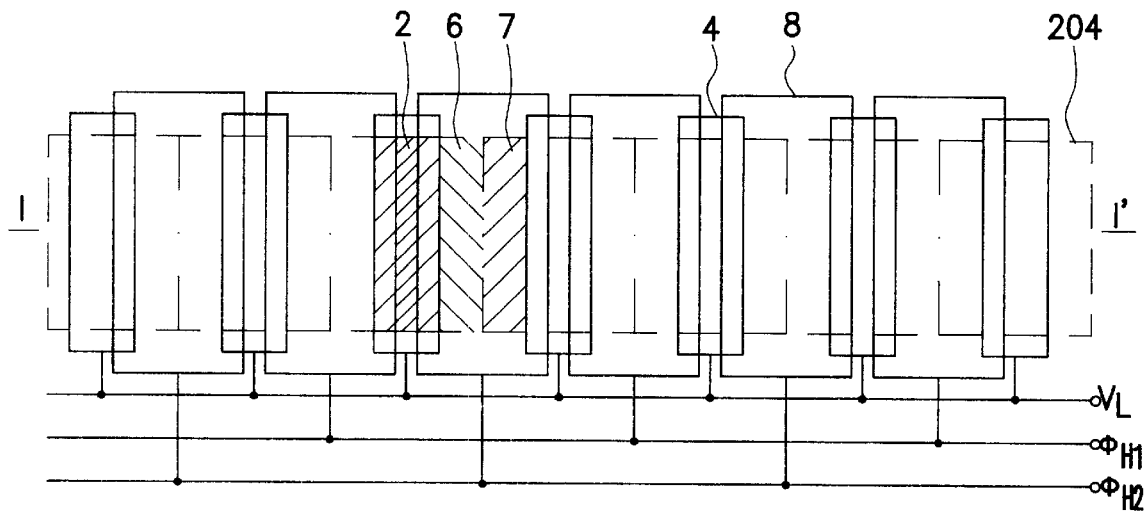
FIG. 4 is a plan view of the charge transfer device showing a first embodiment of this invention.
Figure 5A:
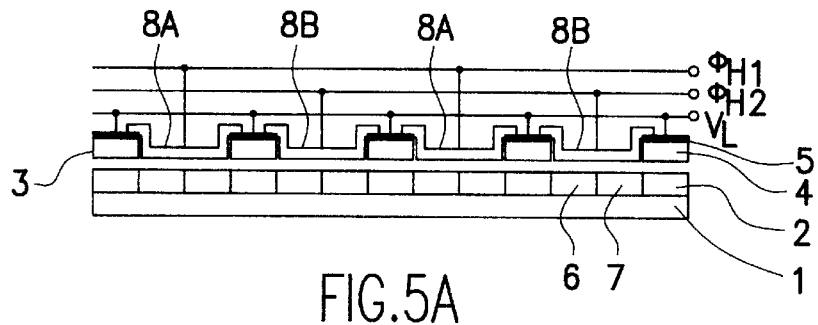
FIGS. 5(a)–5(d) shows a structure and potential diagrams of the charge transfer device of the first embodiment of this invention.

A plan view of a specific configuration of the horizontal transfer device 204 is shown in FIG. 4. Besides, a sectional view along a line I–I' in FIG. 4 is shown in FIG. 5(a). On a P-type semiconductor substrate 1 there is formed an N-type semiconductor layer 2 by ion implantation. N$^-$-type semiconductor regions 6 and N$^{--}$-type semiconductor regions 7 are formed by further selective ion implantations. In other words, differing from the conventional example, this embodiment includes three kinds of N-type semiconductor layers with mutually different impurity concentrations.

A silicon oxide film, namely, an insulating film 3, is formed by thermal oxidation on the N-type semiconductor regions 2, N$^-$-type semiconductor regions 6 and N$^{--}$-type semiconductor regions 7. On the insulating film 3 there are formed first electrodes 4 so as to cover a part of each of the N-type semiconductor regions 2. Further, second electrodes 8 are formed so as to cover a part of each of the N$^-$-type regions 6 and a part of each of the N$^{--}$-type regions 7. As shown in FIG. 4 and FIG. 5(a), the second electrodes 8 are formed consecutively, with two types of even-numbered electrodes 8a and odd-numbered electrodes 8b. The electrodes 8a receive a clock pulse $\phi_{H1}$ and the electrodes 8b receive a clock pulse $\phi_{H2}$. A constant voltage $V_L$ which is equal to the low level voltage of the clock pulses $\phi_{H1}$ and $\phi_{H2}$ is applied to the first electrodes 4.

Figure 1A:
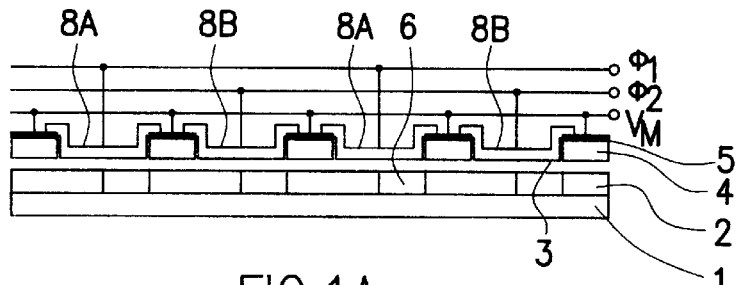
FIGS. 1(a)–1(d) shows a structure and potential diagrams of a charge transfer device of the prior art.
Figure 1B:
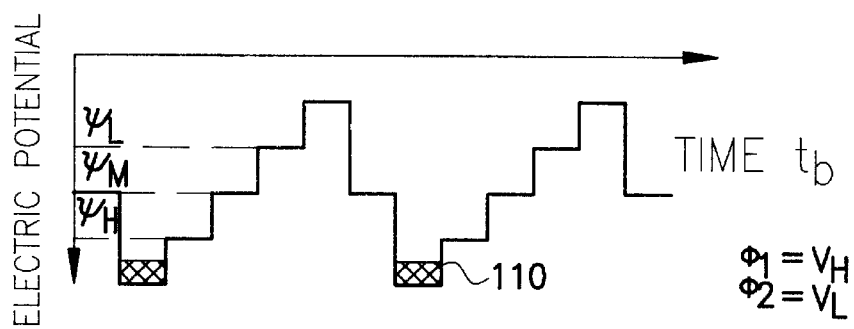
Figure 1C:
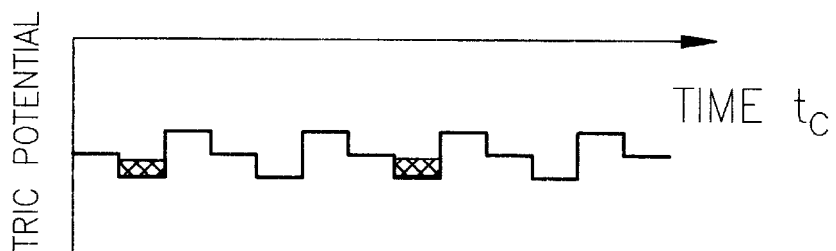
Figure 1D:
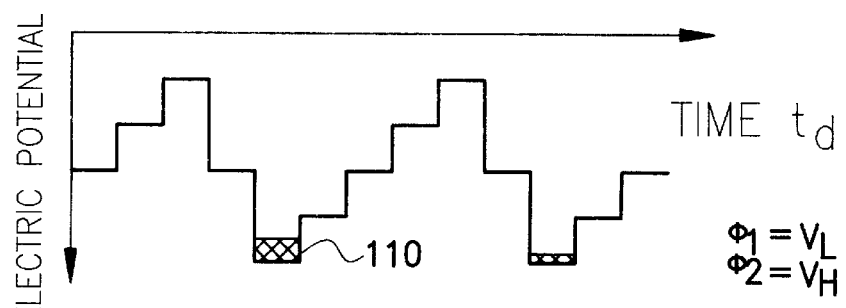
Figure 2:
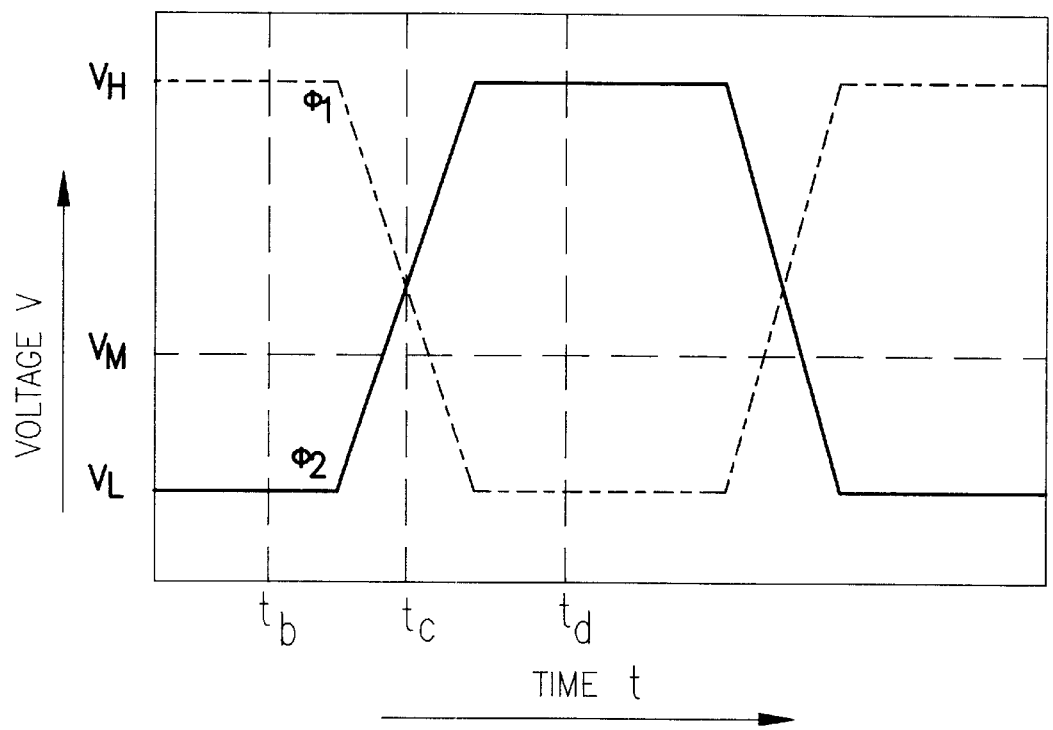
FIG. 2 is a waveform diagram of the clock pulses used in the prior art.
Figure 6:
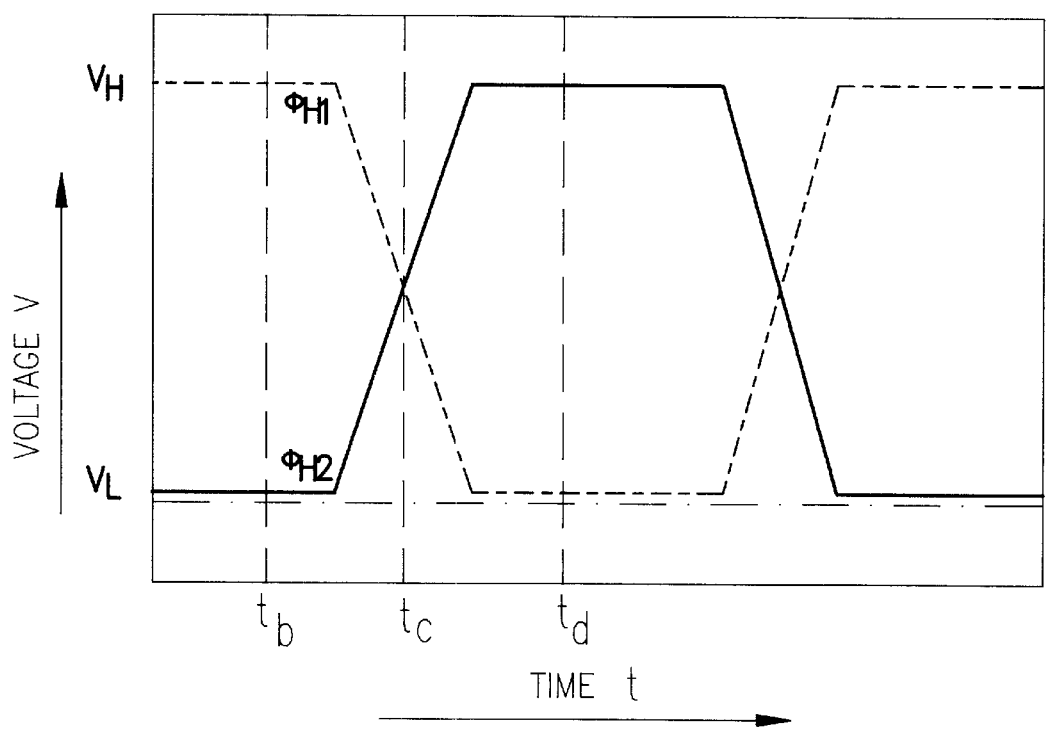
FIG. 6 is a waveform diagram of the clock pulses used in this invention.
Figure 5B:
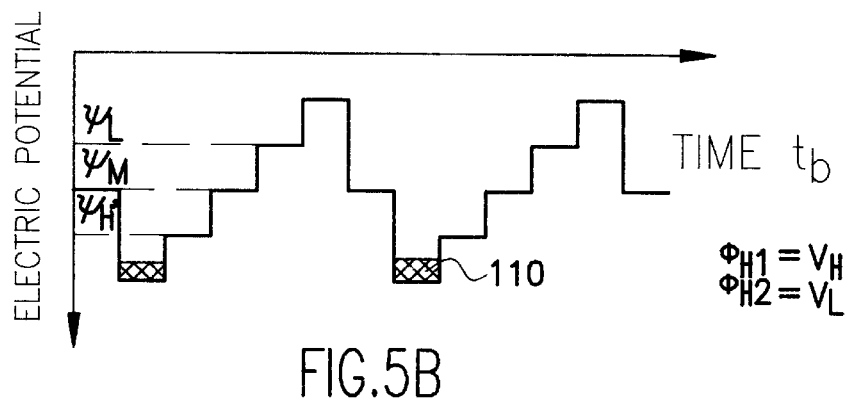
Figure 5C:
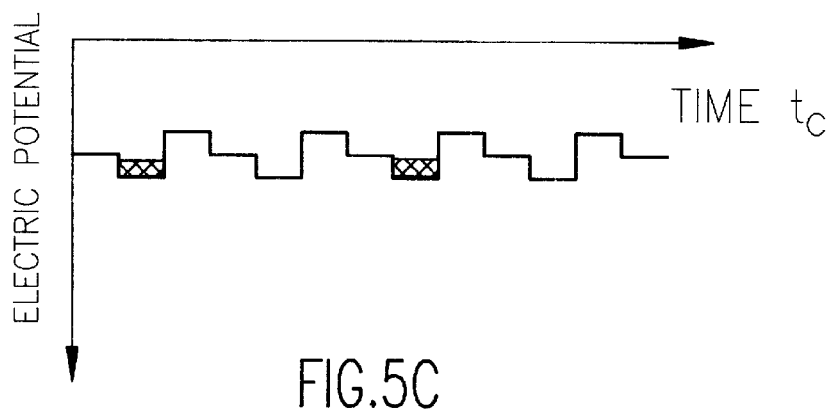
Figure 5D:
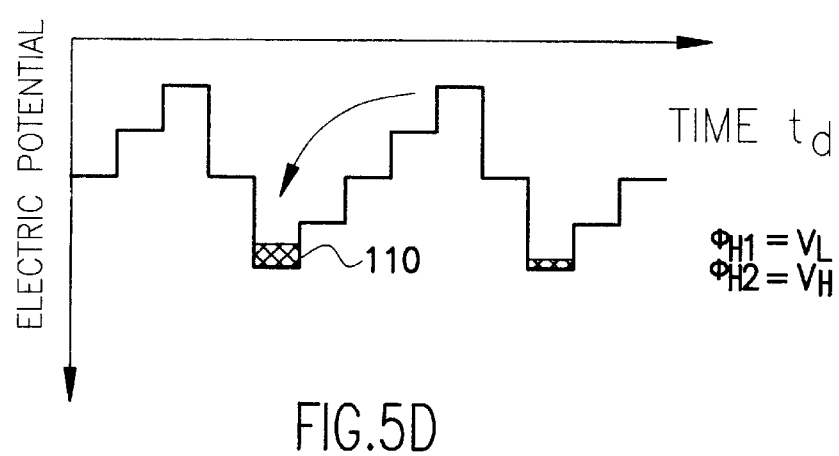

Referring to FIGS. 5(b), 5(c) and 5(d), the operation of the horizontal transfer part 204 shown in FIG. 5(a) will be described. The clock pulses $\phi_{H1}$ and $\phi_{H2}$ are signals that vary in complementary fashion which take on respectively a high level voltage $V_H$ and a low level voltage $V_L$ alternately. FIG. 5(b), 5(c) and 5(d) are electric potential diagrams at the times tb, tc and td, respectively, in FIG. 6.

At the time tb, the high level voltage $V_H$ is applied to the electrodes 8a, and the low level voltage $V_L$ is applied to the electrodes 8b. How a signal charge 110 transferred from the vertical transfer part 203 is further transferred in this situation will be described next.

In this case, signal charges are accumulated in the N$^-$-type semiconductor regions 6 covered with the electrodes 8a. This is because the electrodes 8a receive the high level voltage $V_H$, and hence their electric potential is the deepest.

At the time tc, the electric potential of the semiconductor regions covered with the electrodes 8a becomes shallow, and the electric potential of the semiconductor regions covered with the electrodes 8b become deep due to variations in the potential of the clock pulses $\phi_{H1}$ and $\phi_{H2}$. The situation is as illustrated in FIG. 5(c).

At the time td, the low level voltage $V_L$ is applied to the electrodes 8a and the high level voltage $V_H$ is applied to the electrodes 8b. As a result, the electric potential of the semiconductor regions covered with the electrodes 8a becomes shallower and the electric potential of the semiconductor regions covered with the electrodes 8b becomes deeper, compared with the situation at the time tc. Consequently, the signal charges 110 accumulated in the N$^-$-type semiconductor regions 6 covered with the electrodes 8a at the time tb make transitions at the time td as shown by an arrow in FIG. 5(d). In other words, the signal charges 110 are all moved to the N$^-$-type semiconductor regions 6 covered with the electrodes 8b, and accumulated there.

Thereafter, the signal charges 110 are transferred sequentially by repeating the above operation.

Next, referring to FIGS. 7(a)–7(e), a method of manufacturing the horizontal transfer part 204 will be described.

An N-type semiconductor layer 2 is formed by implanting ions of an N-type impurity such as phosphorus to a concentration of about $10^{17}$ cm$^{-3}$ into a P-type semiconductor substrate 1 with impurity concentration of about $10^{15}$ cm$^{-3}$. Next, an insulating film 3 is formed by thermally oxidizing the N-type semiconductor layer 2. Then, first electrodes 4 are formed selectively by photolithography (FIG. 7(a)).

Next, ions of a P-type impurity such as boron are implanted using the first electrodes 4 as masks. As a result, N$^-$-type semiconductor layers 6 with impurity concentration of about $0.8 \times 10^{17}$ cm$^{-3}$ are formed in self-aligned fashion (FIG. 7(b)).

Ions of a P-type impurity such as boron are further implanted using photoresists 10 and one end of each of the first electrodes 4 as masks. As a result, N$^{--}$-type semiconductor layers 7 with impurity concentration of about $0.6 \times 10^{17}$ cm$^{-3}$ are formed self-aligned with one end of each of the first electrodes 4 (FIG. 7(c)).

Next, following removal of the insulating film 3 once, an insulating film 5 is formed again by thermal oxidation. Subsequently, second electrodes 8 are formed and respective electrodes are connected with wirings, completing the horizontal transfer part 204 (FIGS. 7(d) and 7(e)).

The present embodiment includes three kinds of N-type semiconductor layers, namely, an N-type semiconductor layer 2, an N$^-$-type semiconductor layer 6 and an N$^{--}$-type semiconductor layer 7. Consequently, electric potentials similar to those of the prior art can be obtained even without the use of a voltage intermediate between the high level voltage $V_H$ and the low level voltage $V_L$ required by the prior art. What needs be pointed out here is the fact that the electric potential $\psi_{M1}$ formed in the N-type semiconductor layers 2 directly below the first electrodes 4 is shallower than the electric potential $\psi_H$ formed in the N$^{--}$-type semiconductor layers 7 by the high level voltage $V_H$ applied to the electrodes 8a, and that the electric potential $\psi_{M1}$ is deeper than the electric potential $\psi_L$ formed in the N$^-$-type semiconductor layer 6 by the low level voltage $V_L$ applied to the electrodes 8b. In other words, the intended charge transfer operation becomes feasible by virtue of the validity of such a relation among the electric potentials.

According to the configuration of this embodiment, the constitution of the device can be made simpler and the number of terminals can be reduced if, for example, the ground potential is taken as the low level voltage $V_L$. Besides, the horizontal transfer part 204 is described in this embodiment, but the configuration of the horizontal transfer part 204 can also be applied to the vertical transfer part 203. In other words, it can be applied to all types of devices having the function of transferring the signal charges.

Figure 8A:
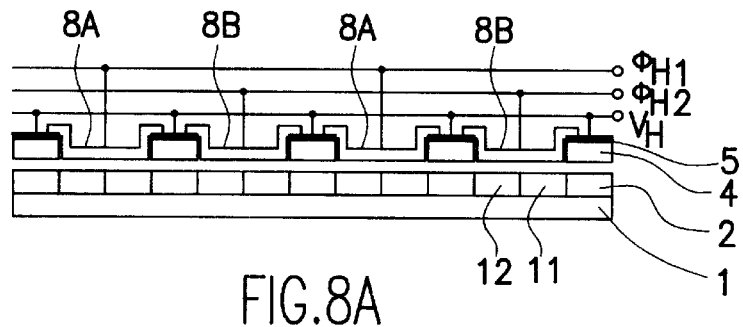
FIGS. 8(a)–8(d) shows a structure and potential diagrams of the charge transfer device of a second embodiment according to this invention.

Next, referring to FIGS. 8(a)–8(d), a second embodiment of this invention will be described. In the first embodiment of the charge transfer part, three kinds of semiconductor layers, namely, an N-type semiconductor layer, an N$^-$-type semiconductor layer and an N$^{--}$-type semiconductor layer are formed. In this embodiment, however, three kinds of semiconductor layers, namely, an N-type semiconductor layer, an N$^{++}$-type semiconductor layer and an N$^+$-type semiconductor layer will be formed. A specific configuration is shown in FIG. 8(a) in which component parts identical to those of FIG. 5(a) are given identical numbers. Accordingly, the difference in the configurations of FIG. 8(a) and FIG. 5(a) resides in the fact that an N$^{++}$-type semiconductor layer 12 and an N$^-$-type semiconductor layer 11 are formed in FIG. 8(a) in place of the N$^-$-type semiconductor layer 6 and the N$^{--}$-type semiconductor layer 7 in FIG. 5(a). In the configuration shown in FIG. 8(a), a constant voltage $V_H$ which is the voltage equal to the high level voltage of the clock pulses $\phi_{H1}$ and $\phi_{H2}$ is applied to the first electrodes 4.

A method of manufacturing the second embodiment is shown in FIGS. 9(a)–9(e) where the component parts identical to those in FIGS. 7(a)–7(e) are given identical numbers.

An N-type semiconductor layer 2 is formed by implantating ions of an N-type impurity such as phosphorus to a concentration of about $10^{17}$ cm$^{-3}$ into a P-type semiconductor substrate with impurity concentration of about $10^{15}$ cm$^{-3}$. Next, an insulating film 3 is formed by thermally oxidizing the surface of the N-type semiconductor layer 2. Following that, first electrodes 4 are formed selectively by photolithography (FIG. 9(a)).

Figure 9A:
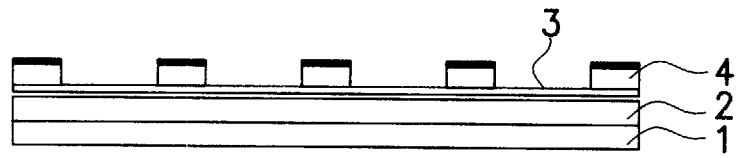
FIGS. 9(a)–9(e) shows diagrams for manufacturing the charge transfer device of the second embodiment according to this invention.
Figure 9B:
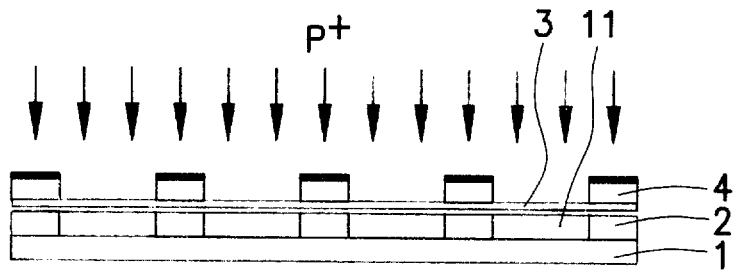

Next, N$^+$-type semiconductor layers 11 with impurity concentration of about $1.2 \times 10^{17}$ cm$^{-3}$ are formed in self-aligned fashion by implanting ions of an N-type impurity such as phosphorus by using the first electrodes 4 as masks (FIG. 9(b)).

Figure 9C:
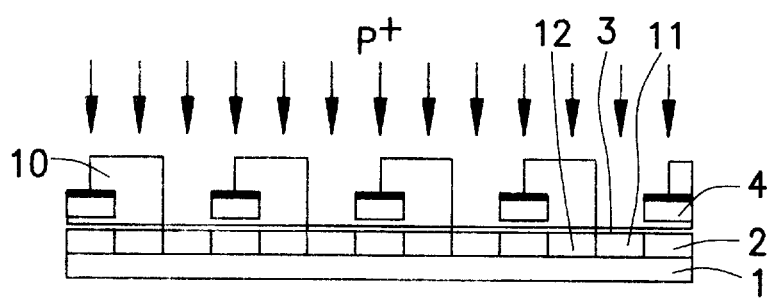
Figure 9D:
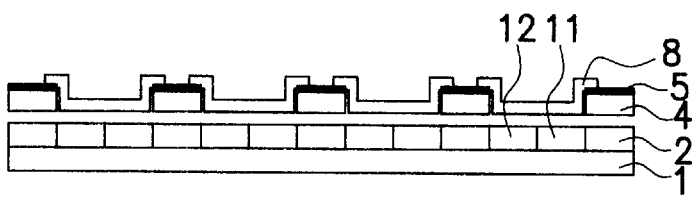
Figure 9E:
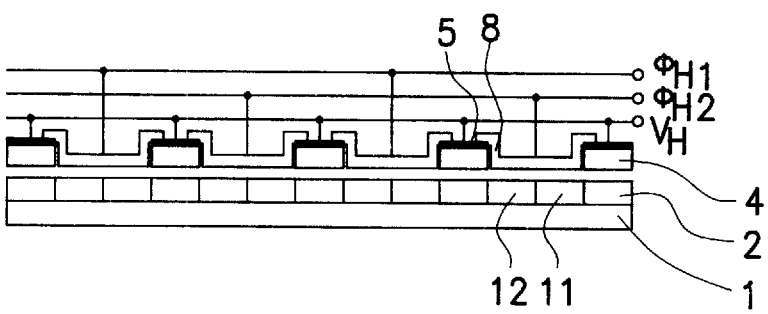

By a further implantation of an N-type impurity such as phosphorus using photoresists 10 and one end of each of the first electrodes 4 as masks, N$^{++}$-type semiconductor layers 12 with impurity concentration of about $1.4 \times 10^{17}$ cm$^{-3}$ are formed in self-alignment with one end of each of the first electrodes 4 (FIG. 9(c)).

Next, after removal of the insulating film 3 once, an insulating film 5 is formed again by thermal oxidation. Following that second electrodes 8 are formed and respective electrodes are connected to wirings, completing the horizontal transfer part (FIGS. 9(d) and 9(e)).

Figure 7A:
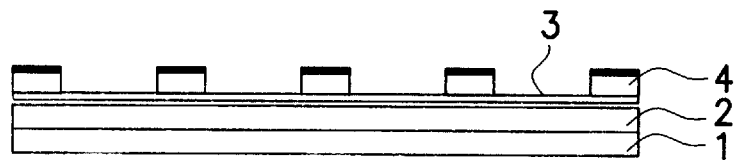
FIGS. 7(a)–7(e) shows diagrams for manufacturing the charge transfer device of the first embodiment according to this invention.
Figure 7B:
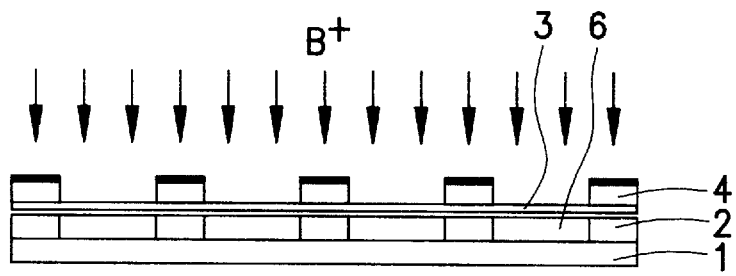
Figure 7C:
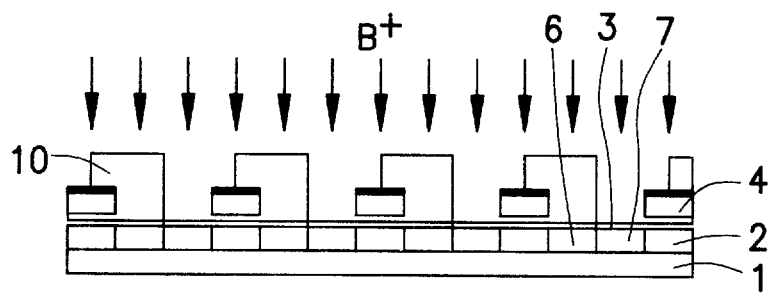
Figure 7D:
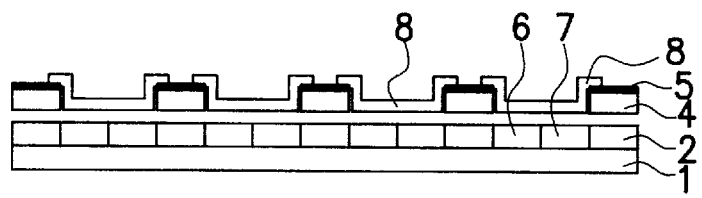
Figure 7E:
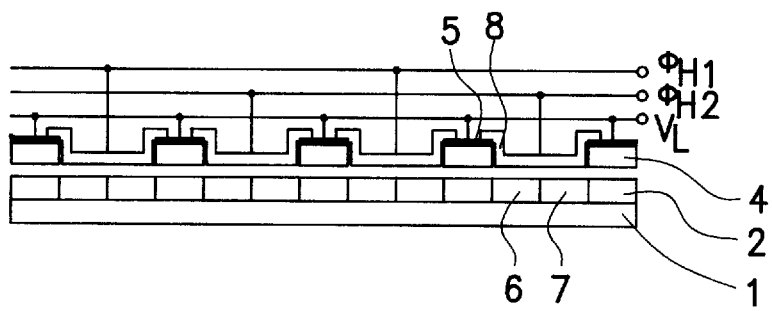
Figure 8B:
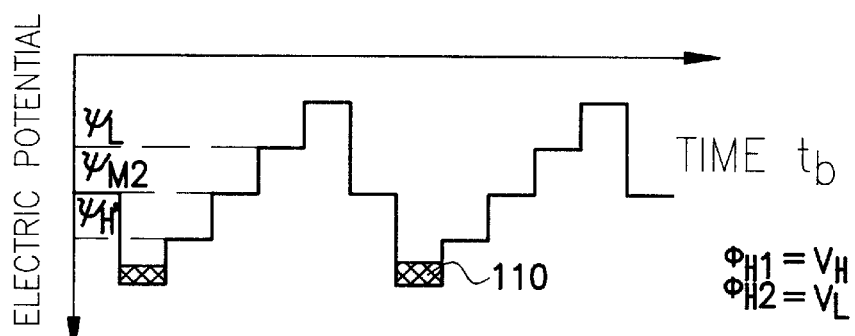
Figure 8C:
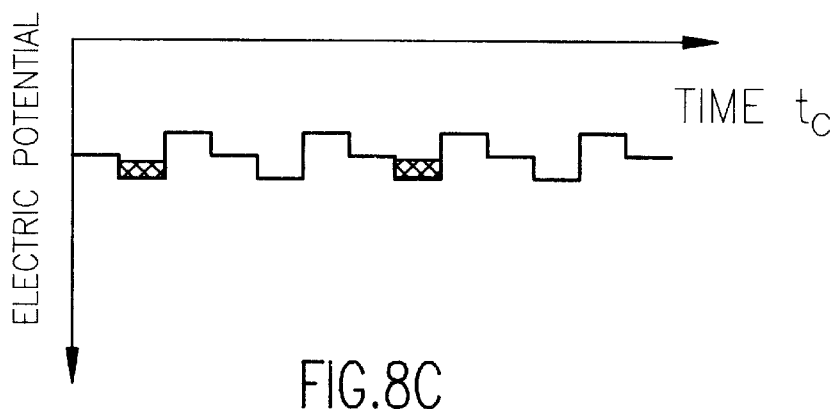
Figure 8D:
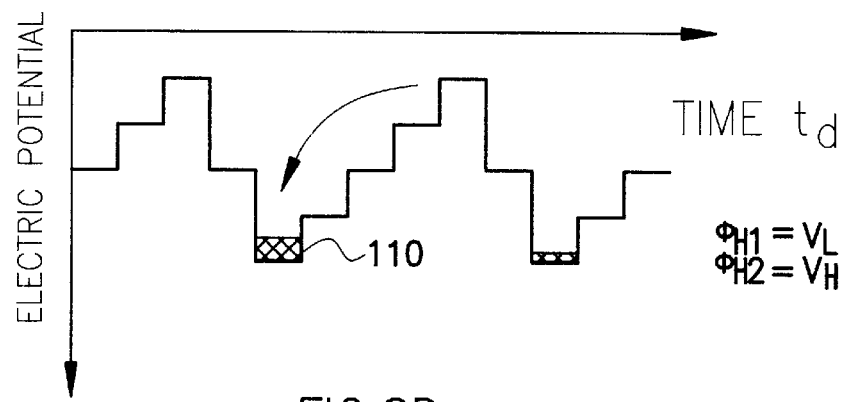

In this embodiment, electric potentials suitable for charge transfer can be obtained as shown in FIGS. 8(b), 8(c) and 8(d). Besides, the description about the operation shown in FIGS. 8(b), 8(c) and 8(d) will be omitted since it is similar to that of FIGS. 7(a)–7(e).

In the first and the second embodiment of this invention, an embedded charge transfer device formed within a P-type semiconductor substrate has been disclosed, but an N-type semiconductor substrate may be used instead. Namely, the conductivity types indicated in FIG. 5(a) and FIG. 8(a) may respectively be changed to corresponding opposite conductivity types. Moreover, the N-type semiconductor layer 2 in FIG. 7(a) and FIG. 9(a) is assumed to be formed by ion implantation, but it may be grown epitaxially on the P-type semiconductor substrate. Furthermore, the present invention may be applied to a surface type charge transfer device without being limited to the embedded type charge transfer device provided that a configuration similar to the scope of this invention is obtainable. In other words, a surface type charge transfer device can be obtained if three semiconductor layers with mutually different concentrations can be secured by implantations of impurities having the conductivity type same as that of the substrate, and electric potentials complying with the scope of this invention can be obtained.

What is claimed is:

1. A charge transfer device comprising a charge transfer region, having a plurality of sets of regions, each of said sets of regions including:

at least three regions, each of said three regions being of a same depth and having impurity concentrations different from one another;

a first electrode covering two adjacent regions of said at least three regions; and a second electrode covering a third region of said at least three regions, wherein said first electrode of each of alternate ones of said sets are supplied with a first clock pulse and said first electrode of each of remaining ones of said sets are supplied with a second clock pulse having a phase different than that of said first clock pulse, said first pulse and second clock pulse alternating between a first voltage and a second voltage, wherein said second electrode is supplied with one of said first voltage and said second voltage as a constant power source.

2. A charge transfer device as claimed in claim 1, wherein said three regions comprise:

a first semiconductor region having a first impurity concentration;

a second semiconductor region having a second impurity concentration lower than said first impurity concentration; and a third semiconductor region having a third impurity concentration lower than said second impurity concentration, said second electrode being positioned on said first semiconductor region and said first electrode being positioned on said second semiconductor region and said third semiconductor region.

3. A charge transfer device as claimed in claim 2, wherein said charge transfer region comprises N-type regions formed by implanting ions into a P-type semiconductor substrate.

4. A charge transfer device as claimed in claim 1, wherein said three regions comprise:

a first semiconductor region having a first impurity concentration;

a second semiconductor region having a second impurity concentration lower than said first impurity concentration; and a third semiconductor region having a third impurity concentration lower than said second impurity concentration, said second electrode being positioned on said third semiconductor region and said first electrode being positioned on said first semiconductor region and said second semiconductor region.

5. A charge transfer device as claimed in claim 4, wherein said charge transfer region comprises a plurality of N-type regions formed by implanting ions into a P-type semiconductor substrate.

6. A charge transfer device comprising:

a plurality of blocks formed consecutively in a semiconductor substrate and comprising a charge transfer path, each of said blocks comprising three regions being of a same depth and having mutually different impurity concentrations;

a plurality of first electrodes, each covering two adjacent regions of said three regions, wherein complementary clock signals are supplied to adjacent ones of said plurality of said first electrodes, said complimentary clock signals alternating between a first voltage and a second voltage; and a plurality of second electrodes, each covering a third region of said three regions and being supplied with one of said first voltage and said second voltage as a constant potential.

7. A charge transfer device as claimed in claim 6, wherein said three regions comprise:

a first semiconductor region having a first impurity concentration;

a second semiconductor region having a second impurity concentration lower than said first impurity concentration; and a third semiconductor region having a third impurity concentration lower than said second impurity concentration;

wherein each of said second electrodes are positioned on said first semiconductor region, and wherein each of said first electrodes are positioned on said second semiconductor region and said third semiconductor region.

8. A charge transfer device as claimed in claim 6, wherein said three regions comprise:

a first semiconductor region having a first impurity concentration;

a second semiconductor region having a second impurity concentration lower than said first impurity concentration;

a third semiconductor region having a third impurity concentration lower than said second impurity concentration;

wherein each of said second electrodes are positioned on said third semiconductor region, and wherein each of said first electrodes are positioned on said first semiconductor region and said second semiconductor region.

9. A semiconductor device comprising:

a plurality of photo-diodes;

a vertical transfer part for receiving a plurality of signals from said plurality of photo-diodes and for transferring said signals sequentially; and a horizontal transfer part for receiving said signals transferred from said vertical transfer part and for transferring said signals sequentially to an output terminal, at least one of said horizontal transfer part and said vertical transfer part having a plurality of consecutively arranged blocks, each of said blocks including three semiconductor regions being of a same depth and having a same conductivity type of mutually different impurity concentrations, wherein complementary clock pulses, alternating between a first voltage and a second voltage, are supplied in to even-numbered blocks and odd-numbered blocks of said plurality of blocks, said semiconductor device further comprising a first electrode covering two adjacent semiconductor regions of said three semiconductor regions and being supplied with a clock pulse of said complementary clock pulses; and a second electrode covering a third semiconductor region of said three semiconductor regions and being supplied with one of said first voltage and said second voltage as a constant potential.

* * * * *